United States Patent
Aigo et al.

(10) Patent No.: US 8,927,396 B2
(45) Date of Patent: Jan. 6, 2015

(54) PRODUCTION PROCESS OF EPITAXIAL SILICON CARBIDE SINGLE CRYSTAL SUBSTRATE

(75) Inventors: Takashi Aigo, Tokyo (JP); Hiroshi Tsuge, Tokyo (JP); Masakazu Katsuno, Tokyo (JP); Tatsuo Fujimoto, Tokyo (JP); Hirokatsu Yashiro, Tokyo (JP)

(73) Assignee: Nippon Steel & Sumitomo Metal Corporation, Tokyo (JP)

( * ) Notice: Subject to any disclaimer, the term of this patent is extended or adjusted under 35 U.S.C. 154(b) by 0 days.

(21) Appl. No.: 13/881,231

(22) PCT Filed: Nov. 15, 2011

(86) PCT No.: PCT/JP2011/076303
§ 371 (c)(1),
(2), (4) Date: Apr. 24, 2013

(87) PCT Pub. No.: WO2012/067112
PCT Pub. Date: May 24, 2012

(65) Prior Publication Data
US 2013/0217213 A1  Aug. 22, 2013

(30) Foreign Application Priority Data
Nov. 17, 2010  (JP) .................................. 2010-256495

(51) Int. Cl.
*H01L 21/20* (2006.01)
*H01L 21/02* (2006.01)
(Continued)

(52) U.S. Cl.
CPC .......... *H01L 21/02378* (2013.01); *C30B 25/18* (2013.01); *H01L 21/02529* (2013.01);
(Continued)

(58) Field of Classification Search
CPC .... C30B 25/02; C30B 29/36; H01L 21/0262; H01L 21/02658; H01L 21/02529; H01L 21/02433; H01L 21/02378

USPC ............................................... 438/478
See application file for complete search history.

(56) References Cited

U.S. PATENT DOCUMENTS

| 7,531,433 B2 * | 5/2009 | Ellison et al. ................. 438/478 |
| 2004/0134418 A1 * | 7/2004 | Hirooka ....................... 117/101 |
| 2007/0170148 A1 | 7/2007 | Kuppurao et al. |

FOREIGN PATENT DOCUMENTS

| EP | 1895573 A1 | 3/2008 |
| JP | 2005-277229 A | 10/2005 |

(Continued)

OTHER PUBLICATIONS

International Search Report Issued in PCT/JP2011/076303, mailed on Jan. 24, 2012.

(Continued)

*Primary Examiner* — Reema Patel
*Assistant Examiner* — Syed Gheyas
(74) *Attorney, Agent, or Firm* — Birch, Stewart, Kolash & Birch, LLP

(57) ABSTRACT

An object of the present invention is to provide a production process of an epitaxial silicon carbide single crystal substrate having a high-quality silicon carbide single crystal thin film reduced in the surface defect and the like on a silicon carbide single crystal substrate with a small off-angle. According to the present invention, in the production process of an epitaxial silicon carbide single crystal substrate having a high-quality silicon carbide single crystal thin film reduced in the surface defect and the like on a silicon carbide single crystal substrate with an off-angle of 4° or less, pretreatment etching to a depth of 0.1 to 1 μm is performed at a temperature of 1,550 to 1,650° C. by flowing a gas containing silicon and chlorine together with a hydrogen gas such that the silicon atom concentration becomes from 0.0001 to 0.01% based on hydrogen atoms in the hydrogen gas, and thereafter, an epitaxial layer is formed.

7 Claims, 3 Drawing Sheets

(51) Int. Cl.
*C30B 25/18* (2006.01)
*C30B 29/36* (2006.01)
*C30B 25/02* (2006.01)

(52) U.S. Cl.
CPC ........ *H01L 21/02433* (2013.01); *C30B 25/186* (2013.01); *H01L 21/0262* (2013.01); *C30B 29/36* (2013.01); *H01L 21/02658* (2013.01); *C30B 25/02* (2013.01); *Y10S 438/931* (2013.01)
USPC ............................ 438/478; 438/931; 117/951

(56) References Cited

FOREIGN PATENT DOCUMENTS

| | | | |
|---|---|---|---|
| JP | 2006-321707 A | | 11/2006 |
| JP | 2007-326743 A | | 12/2007 |
| JP | 2007326743 A | * | 12/2007 |
| JP | 2009-531872 A | | 9/2009 |
| JP | 2010-37157 A | | 2/2010 |
| JP | 2011-16703 A | | 1/2011 |

\* cited by examiner

PRODUCTION PROCESS OF EPITAXIAL SILICON CARBIDE SINGLE CRYSTAL SUBSTRATE

TECHNICAL FIELD

The present invention relates to a production process of an epitaxial silicon carbide (SiC) single crystal substrate.

BACKGROUND ART

Silicon carbide (SiC) has excellent heat resistance and mechanical strength and is physically and chemically stable, and therefore is attracting attention as an environment-resistant semiconductor material. In recent years, demands for an SiC single crystal substrate as a substrate for a high-frequency high-voltage resistant electronic device or the like are increasing.

In the case of manufacturing, for example, an electric power device or a high-frequency device by using an SiC single crystal substrate, it is common to epitaxially grow an SiC thin film on the substrate by using a method referred to as a thermal CVD process (thermal chemical vapor deposition process) or directly implant a dopant by an ion implantation process. The latter case requires annealing at a high temperature after the implantation and for this reason, formation of a thin film through epitaxial growth is employed in many cases.

At present, the predominant diameters of an SiC substrate are 3 inches and 4 inches (76 mm and 100 mm), and therefore epitaxial growth is performed on such a substrate, but from the standpoint of, for example, reducing the density of defects such as basal plane dislocation or increasing the yield of a substrate from an SiC ingot, a substrate not having a conventional off-angle of 8° but having an off-angle of about 4° or less is used. In the case of epitaxial growth on a substrate having such a small off-angle, the ratio (C/Si ratio) of the number of carbon atoms to the number of silicon atoms in the raw material gas flowed during growth is generally set to be lower than the conventional ratio. The ratio above is set so as to avoid the fact that as the off-angle becomes smaller, the number of steps on the surface is decreased and this leads to less occurrence of step-flow growth and susceptibility to an increase in step bunching or epitaxial defect. Furthermore, studies are being made to carry out the pre-growth treatment not in conventional hydrogen gas but in hydrogen gas containing silicon or carbon and thereby more improve the surface state of the epitaxial film on a low off-angle substrate (Non-Document 1). In Non-Patent Document 1, a 4°-off SiC substrate is subjected to pretreatment etching in an atmosphere of hydrogen, hydrogen+propane or hydrogen+silane and then to epitaxial growth, and by performing the pretreatment etching in hydrogen+silane, the surface state of the epitaxial film is improved as compared with the conventional epitaxial film. This is due to the fact that etching in the Si-rich state enables not only removal of the surface modification layer but also reduction and stabilization of the surface energy and therefore, when growth is started, generation of step bunching or defect involved in surface energy relaxation is suppressed. However, decomposition of silane causes production of many kinds of compounds taking the form of $Si_xH_y$, and since the ratio thereof is considered to determine the etching state, the surface state after etching cannot be easily controlled with good reproducibility. Furthermore, when the silane concentration is locally increased, silanes combine with each other to form an Si droplet and remain on the substrate, giving rise to a surface defect and in turn, worsen the surface state.

Accordingly, despite an SiC epitaxial growth substrate expected to find application in a device in the future, growth with a low C/Si ratio and pretreatment etching in a hydrogen+silane atmosphere are necessary for obtaining a more excellent surface state than in the conventional film by using a substrate having not a conventional off-angle of 8° but having an off-angle of about 4° or less. However, it is not easy to ensure a stable etching state by controlling the decomposition of silane in this pretreatment etching, and moreover, because of a problem of Si droplet that is generated when the silane concentration is locally increased, stable formation of an epitaxial film with good surface state is difficult. Incidentally, Patent Document 1 describes a technique of incorporating hydrogen chloride (HCl) into a carrier gas of the reaction gas or incorporating chlorine (Cl) into a silicon (Si) raw material gas, during epitaxial growth. This is aiming at enhancing the uniformity of the thickness or doping density of the epitaxial film by etching the epitaxial film with chlorine incorporated or by accelerating the decomposition of the Si raw material gas by chlorine. That is, Patent Document 1 is not related to the pretreatment of epitaxial growth.

Patent Document 2 relates to a production process of an SiC single crystal wafer and describes a technique of applying a surface treatment (for example, chemical-mechanical polishing or hydrogen etching) to the substrate surface before CVD growth and etching the substrate surface in the course of raising or lowering the temperature. However, specific conditions for etching are not disclosed.

Patent Document 3 relates to etching of a substrate surface by an in-situ deposition process. The problem in Patent Document 3 is that a chemical etching substance (such as HCl, $Cl_2$, HF and HBr) and a deposition process gas containing silicon and hydrogen cannot be used together except for under limited conditions because of a safety problem or are incompatible. In order to solve this problem, a technique of reacting a hydrogen-containing gas and a chemical etching substance to form a quasi-stable chemical species adjacently to the wafer surface is described. As for the quasi-stable chemical species, it is indicated that various species vigorously changing in the reaction path of growth and etching are produced and each species has a short life. However, specific conditions enabling realization of high-quality epitaxial growth are not disclosed. In addition, since various quasi-stable chemical species can be produced, an adverse effect may occur on the substrate surface.

RELATED ART

Patent Document

Patent Document 1: Kokai (Japanese Unexamined Patent Publication) No. 2010-37157
Patent Document 2: Kokai No. 2006-321707
Patent Document 3: Kohyo (National Publication of Translated Version) No. 2009-531872

Non-Patent Document

Non-Patent Document 1: K. Kojima, S. Kuroda, H. Okumura and K. Arai: *Mater. Sci. Forum*, Vol. 556-557 (2007), pp. 85-88

SUMMARY OF THE INVENTION

Problems to be Solved by the Invention

As described above, pretreatment etching in a hydrogen+silane atmosphere is necessary for obtaining a more excellent surface state than in the conventional film by using an SiC single crystal substrate having not a conventional off-angle of 8° but having an off-angle of about 4° or less. However, it is not easy to ensure a stable etching state by controlling the decomposition of silane in this pretreatment etching, and moreover, because of a problem of Si droplet that is generated when the silane concentration is locally increased, stable formation of an epitaxial film with good surface state is difficult. Specific etching conditions capable of solving these problems have not yet been found. Under these circumstances, an object of the present invention is to provide a production process for an epitaxial SiC single crystal substrate having a high-quality epitaxial film excellent in the surface state.

Means to Solve the Problems

It has been found that when pretreatment etching is performed by flowing a gas containing silicon and chlorine together with hydrogen gas before epitaxial growth and thereafter, an epitaxial layer is formed, the above-described object can be attained. The present invention has been accomplished based on this finding. That is, the present invention is as follows.

(1) A process for producing an epitaxial silicon carbide single crystal substrate by epitaxially growing silicon carbide on a silicon carbide single crystal substrate, the production process comprising performing pretreatment etching by flowing a gas containing silicon and chlorine together with a hydrogen gas before epitaxial growth and thereafter, forming an epitaxial layer.

(2) The production process of an epitaxial silicon carbide single crystal substrate according to (1), wherein in the pretreatment etching, the silicon atom concentration in the gas containing silicon and chlorine is from 0.0001 to 0.01% based on hydrogen atoms in the hydrogen gas.

(3) The production process of an epitaxial silicon carbide single crystal substrate according to (1), wherein in the pretreatment etching, the chlorine atom concentration in the gas containing silicon and chlorine is from 0.0001 to 0.1% based on hydrogen atoms in the hydrogen gas.

(4) The production process of an epitaxial silicon carbide single crystal substrate according to (1), wherein the gas containing silicon and chlorine used in the pretreatment etching is $SiH_nCl_{4-n}$ (wherein n is an integer of 0 to 3).

(5) The production process of an epitaxial silicon carbide single crystal substrate according to (1), wherein the pretreatment etching is performed at a temperature of 1,550 to 1,650° C.

(6) The production process of an epitaxial silicon carbide single crystal substrate according to (1), wherein in the pretreatment etching, the etching amount is from 0.1 to 1

(7) The production process of an epitaxial silicon carbide single crystal substrate according to (1), wherein the epitaxial growth is performed by a thermal chemical vapor deposition process (CVD process).

(8) The production process of an epitaxial silicon carbide single crystal substrate according to (1), wherein the off-angle of the silicon carbide single crystal substrate is 4° or less.

Effects of the Invention

According to the present invention, an SiC single crystal substrate having a high-quality epitaxial film excellent in the surface state as the epitaxial film on a substrate with an off-angle of about 4° or less can be provided.

Also, when a CVD process is used in the production process of the present invention, easy device configuration and excellent controllability are enjoyed and an epitaxial film high in the uniformity and reproducibility is obtained.

Furthermore, a device using the epitaxial SiC single crystal substrate of the present invention is formed on a high-quality epitaxial film excellent in the surface state and therefore, is improved in its characteristics and yield.

MODE FOR CARRYING OUT THE INVENTION

Specific contents of the present invention are described.

First, epitaxial growth on an SiC single crystal substrate is described.

The apparatus suitably used for epitaxial growth in the present invention may be a horizontal CVD apparatus. The CVD method enjoys a simple device configuration making it possible to control the growth by gas on/off control and therefore, is a growth method excellent in the controllability and reproducibility of an epitaxial film. Also, other than the CVD process, the epitaxial growth can be performed, for example, by a molecular beam epitaxy process (MBE process) or a liquid phase epitaxy process (LPE process).

Figure 1:
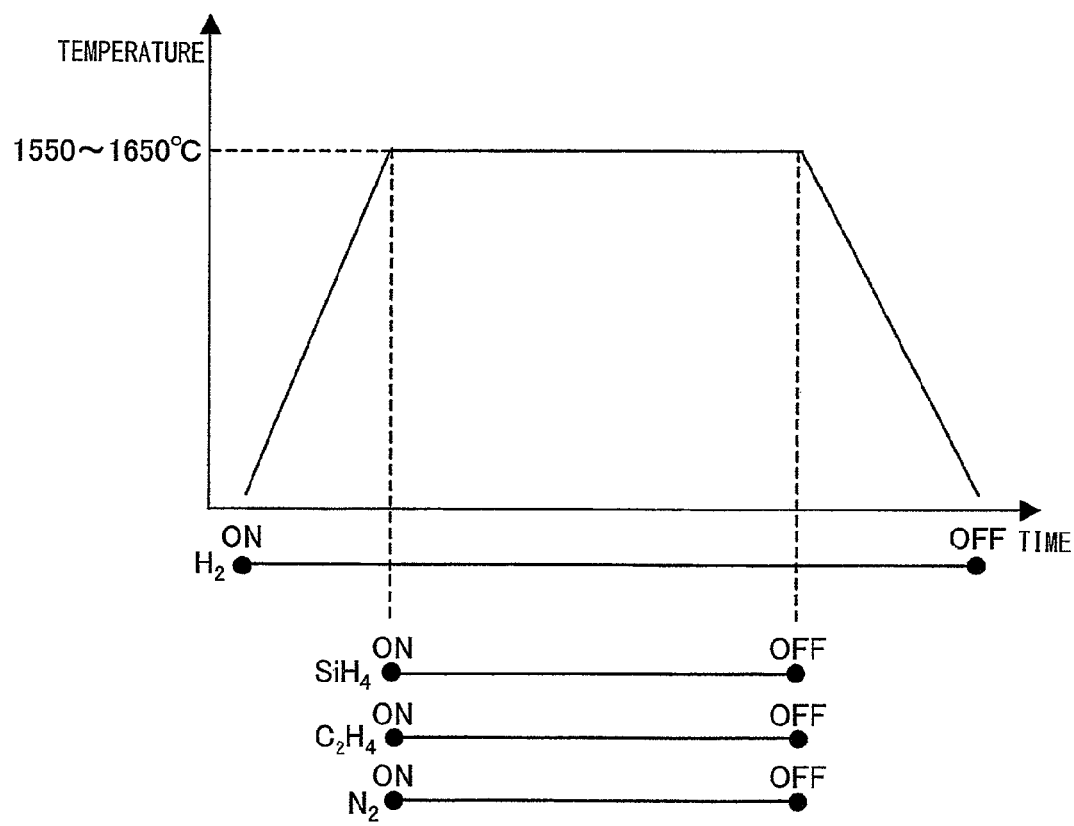
FIG. 1 A view showing a growth sequence when conventional epitaxial growth is performed.

FIG. 1 shows a typical growth sequence in performing the conventional epitaxial film growth, together with the timing of gas introduction. First, a substrate is set in a growth furnace and after evacuating the inside of the growth furnace, a hydrogen gas is introduced to adjust the pressure to be from $1\times10^4$ to $3\times10^4$ Pa. Thereafter, the temperature of the growth furnace is raised while keeping the pressure constant and upon reaching 1,550 to 1,650° C. that is the growth temperature, $SiH_4$ and $C_2H_4$ as material gases and $N_2$ as a doping gas are introduced to start the growth. The $SiH_4$ flow rate is from 40 to 50 cm³/min, the $C_2H_4$ flow rate is from 20 to 40 cm³/min, and the growth rate is from 6 to 7 μm/hour. This growth rate is determined in consideration of the productivity, because the film thickness of an epitaxial layer usually used is about 10 μm. At the point of time when a desired film thickness is obtained by the growth for a given time, introduction of $SiH_4$, $C_2H_4$ and $N_2$ is stopped, and the temperature is lowered in the state of only a hydrogen gas being flowed. Upon temperature dropping to an ordinary temperature, introduction of a hydrogen gas is stopped and after evacuating the inside of the growth chamber and returning the growth chamber to an atmospheric pressure by introducing an inert gas into the growth chamber, the substrate is taken out. In the case of performing the growth in this conventional manner, the process does not have a pretreatment etching step in particular, but an etching treatment is necessarily effected in a hydrogen gas in the course of reaching the growth temperature in a hydrogen gas.

Figure 2:
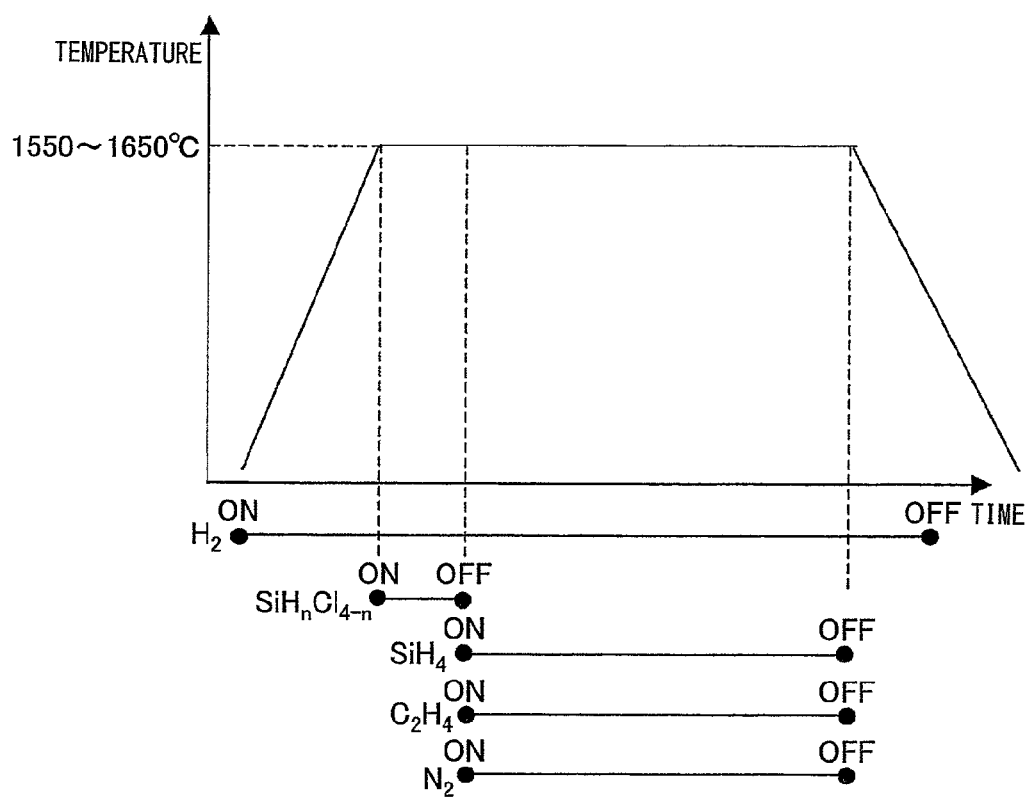
FIG. 2 A view showing a growth sequence when epitaxial growth is performed by one method of the present invention.

Next, the contents of the present invention are described by referring to the growth sequence example of FIG. 2. In this example, an SiC single crystal substrate is set and after evacuating the inside of the growth furnace, a hydrogen gas in introduced to adjust the pressure to be from $1\times10^4$ to $3\times10^4$ Pa. Thereafter, the temperature of the growth furnace is raised while keeping the pressure constant and upon reaching 1,550 to 1,650° C., an $SiH_nCl_{4-n}$ gas (in the formula, n is an integer of 0 to 3) is introduced. At this time, from the standpoint of obtaining a good surface state before growth, the amount of the $SiH_nCl_{4-n}$ gas introduced is preferably from 0.3 to 30 cm$^3$/min, more preferably from 3 to 30 cm$^3$/min. Also, the amount of the hydrogen gas introduced is preferably from 100 to 200 L/min, more preferably from 140 to 160 L/min. After performing pretreatment etching in this state for approximately from 10 to 30 minutes, introduction of the $SiH_nCl_{4-n}$ gas is stopped, and $SiH_4$ and $C_2H_4$ as material gases and $N_2$ as a doping gas are introduced to start the growth. The subsequent procedure is the same as in the case of FIG. 1. The $SiH_nCl_{4-n}$ gas specifically includes silicon tetrachloride ($SiCl_4$), trichlorosilane ($SiHCl_3$), dichlorosilane ($SiH_2Cl_2$) and chlorosilane ($SiH_3Cl$). One of these gases may be used alone, or two or more thereof may be mixed and used. The kind of the material gas is not particularly limited, and in addition to the above-described monosilane and ethylene, a silicon source gas such as disilane, dichlorosilane and trichlorosilane, and a carbon source gas such as propane, methane, ethane and acetylene, may be used. Furthermore, the kind of the carrier gas, the doping gas or the like is also not particularly limited. Incidentally, FIG. 2 is referred to in describing a case where the gas containing silicon and chlorine used for the pretreatment etching is $SiH_nCl_{4-n}$, but a gas prepared by mixing monosilane or disilane with chlorine or hydrogen chloride may be also applied to the pretreatment etching. In this case, the amount of the mixed gas introduced, the amount of a hydrogen gas introduced, and the like are the same as those for the above-described $SiH_nCl_{4-n}$ gas.

In this way, the pretreatment etching is performed by flowing a gas containing silicon and chlorine, such as $SiH_nCl_{4-n}$, together with a hydrogen gas, whereby the surface state of the epitaxial growth film formed is more improved than in the pre-growth etching using silane. The reason therefor is considered as follows. In the case of silane, its decomposition causes production of many kinds of compounds taking the form of $Si_xH_y$, and since the ratio thereof is considered to determine the etching state, it appears difficult to control the etching rate or the surface state after etching with good reproducibility. However, in the case of the $SiH_nCl_{4-n}$ gas or the like, the compound produced by decomposition is believed to take a stable form of $SiCl_2$ in the gas phase, and the supply amount of $SiCl_2$ to the substrate surface can be controlled by the flow rate of the $SiH_nCl_{4-n}$ gas or the like, making it possible to realize a stable etching rate and an Si-rich etching state with good reproducibility, as a result, the surface state of the epitaxial film is improved. Furthermore, $SiCl_2$ is prevented from combining with each other to form an Si droplet and in turn, there is no increase in the surface defect associated therewith. As described above, Patent Document 1 discloses incorporating hydrogen chloride (HCl) into a carrier gas used for epitaxial growth or incorporating chlorine (Cl) into a silicon (Si) raw material gas and states that the epitaxial film is etched with chlorine incorporated or decomposition of the Si raw material gas is accelerated by chlorine. However, the purpose thereof is to enhance the uniformity of the thickness or doping density of the epitaxial film and fundamentally differs in the effect from the purpose of the $SiH_nCl_{4-n}$ gas and the like of the present invention, i.e., to achieve a stable etching rate and an Si-rich etching state thanks to the supply in the form of $SiCl_2$ and thereby realize an optimal state before epitaxial growth.

According to the present invention, an epitaxial film with good surface state can be obtained as the epitaxial film on a substrate having an off-angle of about 4° or less, but if the amount of the $SiH_nCl_{4-n}$ gas or the like is small, etching does not proceed sufficiently, and therefore, a lower limit exists in the flow rate of the gas. Also, if the amount of the $SiH_nCl_{4-n}$ gas is excessively increased, growth may start to form an unnecessary epitaxial film. As a result of studies made by the present inventors in consideration of these circumstances, the concentration of silicon atom in a gas containing silicon and chlorine, such as $SiH_nCl_{4-n}$ gas, based on hydrogen atom in a hydrogen gas (number of silicon atoms/number of hydrogen atoms) is preferably from 0.0001 to 0.01%, more preferably from 0.001 to 0.01%. Also, the concentration of chlorine atom in a gas containing silicon and chlorine, such as $SiH_nCl_{4-n}$ gas, based on hydrogen atom in a hydrogen gas (number of chlorine atoms/number of hydrogen atoms) is preferably from 0.0001 to 0.1%, more preferably from 0.001 to 0.1%.

The temperature at the pretreatment etching is preferably from 1,550 to 1,650° C., because if the temperature is too low, etching may not proceed sufficiently, whereas if the temperature is too high, surface roughening may occur after etching. Furthermore, if the amount removed by etching is too small, the effect of improving the surface state may be inadequate, whereas if the amount is too large, surface unevenness may be increased. Therefore, the surface of the SiC single crystal substrate is preferably etched in the thickness direction in the range of 0.1 to 1 μm, more preferably from 0.3 to 0.6 μm. The present invention exerts its effects particularly in the epitaxial film formation on an SiC substrate having an off-angle of 4° or less but of course produces its effects also on a substrate having an off-angle of more than 4°. The lower limit of the off-angle is 0°.

The device that is suitably formed on the thus-grown epitaxial SiC single crystal substrate is a device used particularly for power control, such as Schottky barrier diode, PIN diode, MOS diode and MOS transistor.

EXAMPLES

Example 1

Epitaxial growth was performed on the Si surface of an SiC single crystal substrate having a 4H polytype prepared by slicing an SiC single crystal ingot for a 3-inch (76 mm) wafer into a thickness of about 400 μm and subjecting it to roughening and normal polishing with a diamond abrasive grain. The off-angle of the substrate was 4°. As for the growth procedure, the substrate was set in a growth furnace and after evacuating the inside of the growth furnace, a hydrogen gas was introduced at 150 L/min to adjust the pressure to $1.0\times10^4$ Pa. Thereafter, the temperature of the growth furnace was raised to 1,600° C. while keeping the pressure constant, and trichlorosilane ($SiHCl_3$) was introduced at 3 cm$^3$/min (the concentrations of silicon atom and chlorine atom in the trichlorosilane based on hydrogen atom in the hydrogen gas were 0.001% and 0.003%, respectively) to effect pretreatment etching of about 0.5 μm. Subsequently, introduction of trichlorosilane was stopped, and an epitaxial layer was grown to about 10 μm by setting the $SiH_4$ flow rate to 40 cm$^3$/min, the $C_2H_4$ flow rate to 22 cm$^3$/min (C/Si ratio: 1.1), and the flow rate of $N_2$ as a doping gas to 1 cm$^3$/min. The amount of the SiC single crystal substrate etched by the pretreatment etching is a value calculated by previously performing an experiment of applying only pretreatment etching to an epitaxial film and measuring the film thickness before and after etching, by an FT-IR method (using, for example, an FTIR apparatus of Nanometrics Inc.) or the like.

Figure 3:
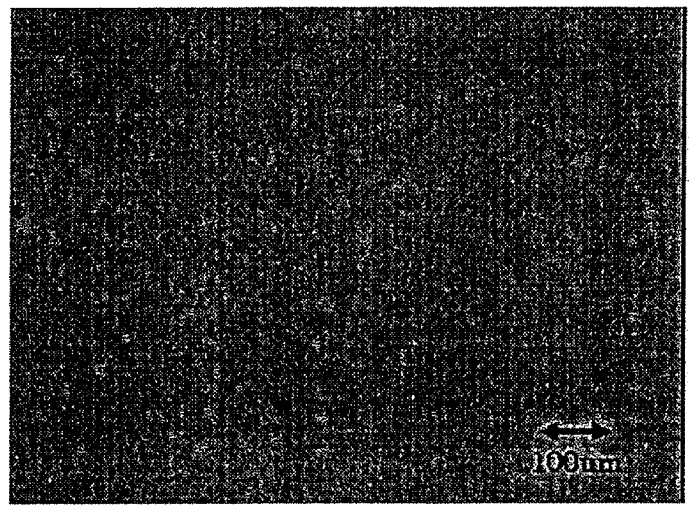
FIG. 3 An optical micrograph showing the surface state of a film when epitaxial growth is performed by one method of the present invention.

FIG. 3 shows an optical micrograph (a differential interference image using a microscope, MX61, of Olympus Corporation) of the film epitaxially grown as above. It is seen from FIG. 3 that a good film with reduced surface roughness or defect is obtained. The surface of this epitaxial film was evaluated by AFM (using, for example, an AFM apparatus manufactured by Bruker), as a result, the surface roughness Ra value (arithmetic average surface roughness: JIS B0601-1994) was 0.20 nm, revealing excellent flatness.

Example 2

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 4°. The procedure until starting the pre-growth treatment, the temperature, the introduction of a hydrogen gas and the like were the same as in Example 1, and after reaching 1,600° C., dichlorosilane ($SiH_2Cl_2$) was introduced at 6 cm$^3$/min (the concentrations of silicon atom and chlorine atom in the dichlorosilane based on hydrogen atom in the hydrogen gas were 0.002% and 0.004%, respectively) to effect pretreatment etching of about 0.5 μm. Subsequently, introduction of dichlorosilane was stopped, and an epitaxial layer was grown to about 10 μm by setting the $SiH_4$ flow rate to 40 cm$^3$/min, the $C_2H_4$ flow rate to 20 cm$^3$/min (C/Si ratio: 1.0), and the flow rate of $N_2$ as a doping gas to 1 cm$^3$/min. The thus epitaxially grown film was a good film with reduced surface roughness or defects, and the surface roughness Ra value was 0.22 nm, revealing excellent flatness.

Example 3

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 4°. The procedure until starting the pre-growth treatment, the temperature, the introduction of a hydrogen gas and the like were the same as in Example 1, and after reaching 1,600° C., chlorosilane ($SiH_3Cl$) was introduced at 20 cm$^3$/min (the concentration of each of silicon atom and chlorine atom in the chlorosilane based on hydrogen atom in the hydrogen gas was 0.007%) to effect pretreatment etching of about 0.6 μm. Subsequently, introduction of chlorosilane was stopped, and an epitaxial layer was grown to about 10 μm by setting the $SiH_4$ flow rate to 40 cm$^3$/min, the $C_2H_4$ flow rate to 16 cm$^3$/min (C/Si ratio: 0.8), and the flow rate of $N_2$ as a doping gas to 1 cm$^3$/min. The thus epitaxially grown film was a good film with reduced surface roughness or defect, and the surface roughness Ra value was 0.25 nm, revealing excellent flatness.

Example 4

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 4°. The procedure until starting the pre-growth treatment, the temperature, the introduction of a hydrogen gas and the like were the same as in Example 1, and after reaching 1,550° C., dichlorosilane ($SiH_2Cl_2$) was introduced at 6 cm$^3$/min (the concentrations of silicon atom and chlorine atom in the dichlorosilane based on hydrogen atom in the hydrogen gas were 0.002% and 0.004%, respectively) to effect pretreatment etching of about 0.5 μm. Subsequently, introduction of dichlorosilane was stopped, and an epitaxial layer was grown to about 10 μm by setting the $SiH_4$ flow rate to 40 cm$^3$/min, the $C_2H_4$ flow rate to 20 cm$^3$/min (C/Si ratio: 1.0), and the flow rate of $N_2$ as a doping gas to 1 cm$^3$/min. The thus epitaxially grown film was a good film with reduced surface roughness or defect, and the surface roughness Ra value was 0.23 nm, revealing excellent flatness.

Example 5

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 4°. The procedure until starting the pre-growth treatment, the temperature, the introduction of a hydrogen gas and the like were the same as in Example 1, and after reaching 1,650° C., trichlorosilane ($SiHCl_3$) was introduced at 3 cm$^3$/min (the concentrations of silicon atoms and chlorine atoms in the trichlorosilane based on hydrogen atoms in the hydrogen gas were 0.001% and 0.003%, respectively) to effect pretreatment etching of about 0.6 μm. Subsequently, introduction of trichlorosilane was stopped, and an epitaxial layer was grown to about 10 μm by setting the $SiH_4$ flow rate to 40 cm$^3$/min, the $C_2H_4$ flow rate to 22 cm$^3$/min (C/Si ratio: 1.1), and the flow rate of $N_2$ as a doping gas to 1 cm$^3$/min. The thus epitaxially grown film was a good film with reduced surface roughness or defects, and the surface roughness Ra value was 0.21 nm, revealing excellent flatness.

Example 6

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 4°. The procedure until starting the pre-growth treatment, the temperature, the introduction of a hydrogen gas and the like were the same as in Example 1, and after reaching 1,600° C., silane ($SiH_4$) at 20 cm$^3$/min (the concentration of silicon atom in the silane based on hydrogen atom in the hydrogen gas was 0.007%) and hydrogen chloride (HCl) at 60 cm$^3$/min (the concentration of chlorine atom in the hydrogen chloride based on hydrogen atom in the hydrogen gas was 0.02%) were introduced to effect pretreatment etching of about 0.5 μm. Subsequently, introduction of silane and hydrogen chloride was stopped, and an epitaxial layer was grown to about 10 μm by setting the $SiH_4$ flow rate to 40 cm$^3$/min, the $C_2H_4$ flow rate to 16 cm$^3$/min (C/Si ratio: 0.8), and the flow rate of $N_2$ as a doping gas to 1 cm$^3$/min. The thus epitaxially grown film was a good film with reduced surface roughness or defects, and the surface roughness Ra value was 0.55 nm, revealing excellent flatness.

Example 7

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 4°. The procedure until starting the pre-growth treatment, the temperature, the introduction of a hydrogen gas and the like were the same as in Example 1, and after reaching 1,500° C., trichlorosilane (SiHCl$_2$) was introduced at 3 cm$^3$/min (the concentrations of silicon atom and chlorine atom in the trichlorosilane based on hydrogen atom in the hydrogen gas were 0.001% and 0.003%, respectively) to effect pretreatment etching of about 1.0 μm. Subsequently, introduction of trichlorosilane was stopped, and an epitaxial layer was grown to about 10 μm by setting the SiH$_4$ flow rate to 40 cm$^3$/min, the C$_2$H$_4$ flow rate to 22 cm$^3$/min (C/Si ratio: 1.1), and the flow rate of N$_2$ as a doping gas to 1 cm$^3$/min. The thus epitaxially grown film was a good film with reduced surface roughness or defects, and the surface roughness Ra value was 0.48 nm, revealing excellent flatness.

Example 8

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 6°. The procedure until starting the pre-growth treatment, the temperature, the introduction of a hydrogen gas and the like were the same as in Example 1, and after reaching 1,600° C., trichlorosilane (SiHCl$_3$) was introduced at 3 cm$^3$/min (the concentrations of silicon atom and chlorine atom in the trichlorosilane based on hydrogen atom in the hydrogen gas were 0.001% and 0.003%, respectively) to effect pretreatment etching of about 0.5 μm. Subsequently, introduction of trichlorosilane was stopped, and an epitaxial layer was grown to about 10 μm by setting the SiH$_4$ flow rate to 40 cm$^3$/min, the C$_2$H$_4$ flow rate to 20 cm$^3$/min (C/Si ratio: 1.0), and the flow rate of N2 as a doping gas to 1 cm$^3$/min. The thus epitaxially grown film was a good film with reduced surface roughness or defects, and the surface roughness Ra value was 0.21 nm, revealing excellent flatness.

Examples 9 to 175

Epitaxial growth was performed on the Si surface of a 3-inch (76 mm) SiC single crystal substrate having a 4H polytype prepared by performing slicing, roughening and normal polishing in the same manner as in Example 1. The procedure until starting the pre-growth treatment, the temperature, the introduction of a hydrogen gas and the like were the same as in Example 1, but the off-angle of the substrate, the amount of pretreatment etching, and the gas species and concentration of the SiH$_n$Cl$_{4-n}$ gas were changed as shown in Tables 1 to 6. After the pretreatment etching, introduction of the SiH$_n$Cl$_{4-n}$ gas was stopped, and an epitaxial layer was grown to about 10 μm by setting the SiH$_4$ flow rate to 40 cm$^3$/min, the C$_2$H$_4$ flow rate to 22 cm$^3$/min (C/Si ratio: 1.1), and the flow rate of N$_2$ as a doping gas to 1 cm$^3$/min. The thus epitaxially grown films were a good film with reduced surface roughness or defect, and the surface roughness Ra value was small as shown in Tables 1 to 6. Incidentally, the concentrations (%) in the Tables are the silicon atom concentration (Si concentration) and chlorine atom concentration (Cl concentration) in the SiH$_n$Cl$_{4-n}$ gas, based on hydrogen atom in the hydrogen gas.

TABLE 1

| Example | Gas Species | Off-Angle (°) | Si Concentration (%) | Cl Concentration (%) | Etching Amount (μm) | Ra (nm) |
|---|---|---|---|---|---|---|
| 9 | SiCl$_4$ | 0 | 0.0001 | 0.0004 | 0.1 | 0.37 |
| 10 | | | | | 0.5 | 0.32 |
| 11 | | | | | 1 | 0.32 |
| 12 | | | 0.001 | 0.004 | 0.1 | 0.35 |

TABLE 1-continued

| Example | Gas Species | Off-Angle (°) | Si Concentration (%) | Cl Concentration (%) | Etching Amount (μm) | Ra (nm) |
|---|---|---|---|---|---|---|
| 13 | | | | | 0.5 | 0.29 |
| 14 | | | | | 1 | 0.31 |
| 15 | | | 0.01 | 0.04 | 0.1 | 0.33 |
| 16 | | | | | 0.5 | 0.31 |
| 17 | | | | | 1 | 0.31 |
| 18 | | | 0.0001 | 0.0004 | 1.5 | 0.35 |
| 19 | | | 0.001 | 0.004 | 1.5 | 0.33 |
| 20 | | | 0.01 | 0.04 | 1.5 | 0.30 |
| 21 | | | 0.02 | 0.08 | 0.5 | 0.38 |
| 22 | | | 0.02 | 0.08 | 1.5 | 0.39 |
| 23 | | 2 | 0.0001 | 0.0004 | 0.1 | 0.33 |
| 24 | | | | | 0.5 | 0.28 |
| 25 | | | | | 1 | 0.28 |
| 26 | | | 0.001 | 0.004 | 0.1 | 0.31 |
| 27 | | | | | 0.5 | 0.25 |
| 28 | | | | | 1 | 0.27 |
| 29 | | | 0.01 | 0.04 | 0.1 | 0.29 |
| 30 | | | | | 0.5 | 0.27 |
| 31 | | | | | 1 | 0.27 |
| 32 | | | 0.0001 | 0.0004 | 1.5 | 0.32 |
| 33 | | | 0.001 | 0.004 | 1.5 | 0.31 |
| 34 | | | 0.01 | 0.04 | 1.5 | 0.28 |
| 35 | | | 0.02 | 0.08 | 0.5 | 0.36 |
| 36 | | | 0.02 | 0.08 | 1.5 | 0.37 |

TABLE 2

| Example | Gas Species | Off-Angle (°) | Si Concentration (%) | Cl Concentration (%) | Etching Amount (μm) | Ra (nm) |
|---|---|---|---|---|---|---|
| 37 | SiCl$_4$ | 4 | 0.0001 | 0.0004 | 0.1 | 0.30 |
| 38 | | | | | 0.5 | 0.25 |
| 39 | | | | | 1 | 0.25 |
| 40 | | | 0.001 | 0.004 | 0.1 | 0.28 |
| 41 | | | | | 0.5 | 0.22 |
| 42 | | | | | 1 | 0.24 |
| 43 | | | 0.01 | 0.04 | 0.1 | 0.26 |
| 44 | | | | | 0.5 | 0.24 |
| 45 | | | | | 1 | 0.24 |
| 46 | | | 0.0001 | 0.0004 | 1.5 | 0.30 |
| 47 | | | 0.001 | 0.004 | 1.5 | 0.29 |
| 48 | | | 0.01 | 0.04 | 1.5 | 0.26 |
| 49 | | | 0.02 | 0.08 | 0.5 | 0.34 |
| 50 | | | 0.02 | 0.08 | 1.5 | 0.35 |
| 51 | SiHCl$_3$ | 0 | 0.0001 | 0.0003 | 0.1 | 0.33 |
| 52 | | | | | 0.5 | 0.31 |
| 53 | | | | | 1 | 0.31 |
| 54 | | | 0.001 | 0.003 | 0.1 | 0.29 |
| 55 | | | | | 0.5 | 0.25 |
| 56 | | | | | 1 | 0.27 |
| 57 | | | 0.01 | 0.03 | 0.1 | 0.29 |
| 58 | | | | | 0.5 | 0.28 |
| 59 | | | | | 1 | 0.31 |
| 60 | | | 0.0001 | 0.0003 | 1.5 | 0.33 |
| 61 | | | 0.001 | 0.003 | 1.5 | 0.31 |
| 62 | | | 0.01 | 0.03 | 1.5 | 0.28 |
| 63 | | | 0.02 | 0.06 | 0.5 | 0.36 |
| 64 | | | 0.02 | 0.06 | 1.5 | 0.35 |

TABLE 3

| Example | Gas Species | Off-Angle (°) | Si Concentration (%) | Cl Concentration (%) | Etching Amount (μm) | Ra (nm) |
|---|---|---|---|---|---|---|
| 65 | SiHCl$_3$ | 2 | 0.0001 | 0.0003 | 0.1 | 0.31 |
| 66 | | | | | 0.5 | 0.29 |

TABLE 3-continued

| Example | Gas Species | Off-Angle (°) | Si Concentration (%) | Cl Concentration (%) | Etching Amount (μm) | Ra (nm) |
|---|---|---|---|---|---|---|
| 67 | | | | | 1 | 0.29 |
| 68 | | | 0.001 | 0.003 | 0.1 | 0.27 |
| 69 | | | | | 0.5 | 0.23 |
| 70 | | | | | 1 | 0.25 |
| 71 | | | 0.01 | 0.03 | 0.1 | 0.27 |
| 72 | | | | | 0.5 | 0.26 |
| 73 | | | | | 1 | 0.29 |
| 74 | | | 0.0001 | 0.0003 | 1.5 | 0.31 |
| 75 | | | 0.001 | 0.003 | 1.5 | 0.30 |
| 76 | | | 0.01 | 0.03 | 1.5 | 0.27 |
| 77 | | | 0.02 | 0.06 | 0.5 | 0.35 |
| 78 | | | 0.02 | 0.06 | 1.5 | 0.35 |
| 79 | | 4 | 0.0001 | 0.0003 | 0.1 | 0.29 |
| 80 | | | | | 0.5 | 0.27 |
| 81 | | | | | 1 | 0.27 |
| 82 | | | 0.001 | 0.003 | 0.1 | 0.25 |
| 1 | | | | | 0.5 | 0.20 |
| 83 | | | | | 1 | 0.23 |
| 84 | | | 0.01 | 0.03 | 0.1 | 0.25 |
| 85 | | | | | 0.5 | 0.24 |
| 86 | | | | | 1 | 0.27 |
| 87 | | | 0.0001 | 0.0003 | 1.5 | 0.29 |
| 88 | | | 0.001 | 0.003 | 1.5 | 0.28 |
| 89 | | | 0.01 | 0.03 | 1.5 | 0.25 |
| 90 | | | 0.02 | 0.06 | 0.5 | 0.33 |
| 91 | | | 0.02 | 0.06 | 1.5 | 0.32 |

TABLE 4

| Example | Gas Species | Off-Angle (°) | Si Concentration (%) | Cl Concentration (%) | Etching Amount (μm) | Ra (nm) |
|---|---|---|---|---|---|---|
| 92 | SiH$_2$Cl$_2$ | 0 | 0.0001 | 0.0002 | 0.1 | 0.34 |
| 93 | | | | | 0.5 | 0.32 |
| 94 | | | | | 1 | 0.31 |
| 95 | | | 0.001 | 0.002 | 0.1 | 0.31 |
| 96 | | | | | 0.5 | 0.26 |
| 97 | | | | | 1 | 0.30 |
| 98 | | | 0.01 | 0.02 | 0.1 | 0.30 |
| 99 | | | | | 0.5 | 0.30 |
| 100 | | | | | 1 | 0.32 |
| 101 | | | 0.0001 | 0.0002 | 1.5 | 0.33 |
| 102 | | | 0.001 | 0.002 | 1.5 | 0.32 |
| 103 | | | 0.01 | 0.02 | 1.5 | 0.33 |
| 104 | | | 0.02 | 0.04 | 0.5 | 0.33 |
| 105 | | | 0.02 | 0.04 | 1.5 | 0.35 |
| 106 | | 2 | 0.0001 | 0.0002 | 0.1 | 0.32 |
| 107 | | | | | 0.5 | 0.30 |
| 108 | | | | | 1 | 0.29 |
| 109 | | | 0.001 | 0.002 | 0.1 | 0.29 |
| 110 | | | | | 0.5 | 0.24 |
| 111 | | | | | 1 | 0.28 |
| 112 | | | 0.01 | 0.02 | 0.1 | 0.28 |
| 113 | | | | | 0.5 | 0.28 |
| 114 | | | | | 1 | 0.30 |
| 115 | | | 0.0001 | 0.0002 | 1.5 | 0.30 |
| 116 | | | 0.001 | 0.002 | 1.5 | 0.29 |
| 117 | | | 0.01 | 0.02 | 1.5 | 0.30 |
| 118 | | | 0.02 | 0.04 | 0.5 | 0.30 |
| 119 | | | 0.02 | 0.04 | 1.5 | 0.31 |

TABLE 5

| Example | Gas Species | Off-Angle (°) | Si Concentration (%) | Cl Concentration (%) | Etching Amount (μm) | Ra (nm) |
|---|---|---|---|---|---|---|
| 120 | SiH$_2$Cl$_2$ | 4 | 0.0001 | 0.0002 | 0.1 | 0.30 |
| 121 | | | | | 0.5 | 0.28 |
| 122 | | | | | 1 | 0.27 |
| 123 | | | 0.001 | 0.002 | 0.1 | 0.27 |
| 124 | | | | | 0.5 | 0.22 |
| 125 | | | | | 1 | 0.26 |
| 126 | | | 0.01 | 0.02 | 0.1 | 0.26 |
| 127 | | | | | 0.5 | 0.26 |
| 128 | | | | | 1 | 0.28 |
| 129 | | | 0.0001 | 0.0002 | 1.5 | 0.29 |
| 130 | | | 0.001 | 0.002 | 1.5 | 0.28 |
| 131 | | | 0.01 | 0.02 | 1.5 | 0.29 |
| 132 | | | 0.02 | 0.04 | 0.5 | 0.29 |
| 133 | | | 0.02 | 0.04 | 1.5 | 0.30 |
| 134 | SiH$_3$Cl | 0 | 0.0001 | 0.0001 | 0.1 | 0.36 |
| 135 | | | | | 0.5 | 0.34 |
| 136 | | | | | 1 | 0.34 |
| 137 | | | 0.001 | 0.001 | 0.1 | 0.32 |
| 138 | | | | | 0.5 | 0.28 |
| 139 | | | | | 1 | 0.30 |
| 140 | | | 0.01 | 0.01 | 0.1 | 0.32 |
| 141 | | | | | 0.5 | 0.30 |
| 142 | | | | | 1 | 0.34 |
| 143 | | | 0.0001 | 0.0001 | 1.5 | 0.36 |
| 144 | | | 0.001 | 0.001 | 1.5 | 0.32 |
| 145 | | | 0.01 | 0.01 | 1.5 | 0.36 |
| 146 | | | 0.02 | 0.02 | 0.5 | 0.34 |
| 147 | | | 0.02 | 0.02 | 1.5 | 0.35 |

TABLE 6

| Example | Gas Species | Off-Angle (°) | Si Concentration (%) | Cl Concentration (%) | Etching Amount (μm) | Ra (nm) |
|---|---|---|---|---|---|---|
| 148 | SiH$_3$Cl | 2 | 0.0001 | 0.0001 | 0.1 | 0.34 |
| 149 | | | | | 0.5 | 0.32 |
| 150 | | | | | 1 | 0.32 |
| 151 | | | 0.001 | 0.001 | 0.1 | 0.30 |
| 152 | | | | | 0.5 | 0.26 |
| 153 | | | | | 1 | 0.28 |
| 154 | | | 0.01 | 0.01 | 0.1 | 0.30 |
| 155 | | | | | 0.5 | 0.28 |
| 156 | | | | | 1 | 0.32 |
| 157 | | | 0.0001 | 0.0001 | 1.5 | 0.34 |
| 158 | | | 0.001 | 0.001 | 1.5 | 0.30 |
| 159 | | | 0.01 | 0.01 | 1.5 | 0.34 |
| 160 | | | 0.02 | 0.02 | 0.5 | 0.32 |
| 161 | | | 0.02 | 0.02 | 1.5 | 0.33 |
| 162 | | 4 | 0.0001 | 0.0001 | 0.1 | 0.32 |
| 163 | | | | | 0.5 | 0.30 |
| 164 | | | | | 1 | 0.30 |
| 165 | | | 0.001 | 0.001 | 0.1 | 0.28 |
| 166 | | | | | 0.5 | 0.24 |
| 167 | | | | | 1 | 0.26 |
| 168 | | | 0.01 | 0.01 | 0.1 | 0.28 |
| 169 | | | | | 0.5 | 0.26 |
| 170 | | | | | 1 | 0.30 |
| 171 | | | 0.0001 | 0.0001 | 1.5 | 0.31 |
| 172 | | | 0.001 | 0.001 | 1.5 | 0.27 |
| 173 | | | 0.01 | 0.01 | 1.5 | 0.31 |
| 174 | | | 0.02 | 0.02 | 0.5 | 0.29 |
| 175 | | | 0.02 | 0.02 | 1.5 | 0.30 |

Comparative Example 1

Figure 4:
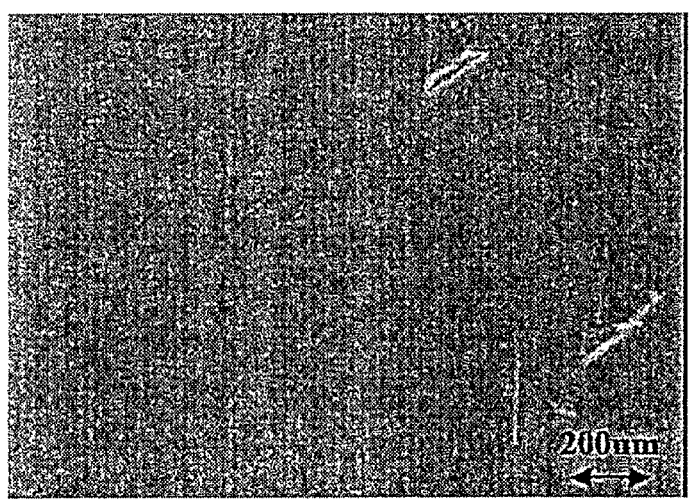
FIG. 4 An optical micrograph showing the surface state of a film when epitaxial growth is performed by the conventional method.

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 4°. The procedure until starting the pre-growth treatment, the temperature, the introduction of a hydrogen gas and the like were the same as in Example 1, but without performing pretreatment etching by flowing a gas containing silicon and chlorine, an epitaxial layer was grown to about 10 μm by setting the SiH$_4$ flow rate to 40 cm$^3$/min, the C$_2$H$_4$ flow rate to 22 cm$^3$/min (C/Si ratio: 1.1), and the flow rate of N$_2$ as a doping gas to 1 cm$^3$/min. FIG. 4 shows an optical micrograph of the film epitaxially grown as above. It is seen from FIG. 4 that this is a film having many triangular defects and large surface roughness, and the surface roughness Ra value was as large as 1.5 nm.

Comparative Example 2

Epitaxial growth was performed on the Si surface of a 3-inch (76 mm) SiC single crystal substrate having a 4H polytype prepared by performing slicing, roughening and normal polishing in the same manner as in Example 1. The off-angle of the substrate was 4°. The procedure until starting the pre-growth treatment, the temperature, the introduction of a hydrogen gas and the like were the same as in Example 1, and after reaching 1,600° C., silane (SiH$_4$) was introduced at 3 cm$^3$/min (the concentration of silicon atom in the silane based on hydrogen atom in the hydrogen gas was 0.001%) to effect pretreatment etching of about 0.5 μm. Subsequently, an epitaxial layer was grown to about 10 μm by setting the SiH$_4$ flow rate to 40 cm$^3$/min, the C$_2$H$_4$ flow rate to 22 cm$^3$/min (C/Si ratio: 1.1), and the flow rate of N$_2$ as a doping gas to 1 cm$^3$/min. In the thus epitaxially grown film, many defects or pits ascribable to unstable pretreatment etching or Si droplet were observed, similarly to FIG. 4, and the surface roughness Ra value was as large as 1.1 nm.

INDUSTRIAL APPLICABILITY

According to this invention, in the epitaxial growth on an SiC single crystal substrate, an epitaxial SiC single crystal substrate having a high-quality epitaxial film with good surface state can be stably produced. In turn, when an electronic device is formed on such a substrate, the characteristics and yield of the device are expected to be enhanced.

The invention claimed is:

1. A process for producing an epitaxial silicon carbide single crystal substrate by epitaxially growing silicon carbide on a silicon carbide single crystal substrate, the production process comprising performing pretreatment etching by flowing at least one gas of the formula SiH$_n$Cl$_{4-n}$, wherein n is an integer of 0 to 3, together with a hydrogen gas before epitaxial growth and thereafter, forming an epitaxial layer.

2. The production process of an epitaxial silicon carbide single crystal substrate according to claim 1, wherein in said pretreatment etching, the silicon atom concentration in the gas containing silicon and chlorine is from 0.0001 to 0.01% based on hydrogen atoms in the hydrogen gas.

3. The production process of an epitaxial silicon carbide single crystal substrate according to claim 1, wherein in said pretreatment etching, the chlorine atom concentration in the gas containing silicon and chlorine is from 0.0001 to 0.1% based on hydrogen atoms in the hydrogen gas.

4. The production process of an epitaxial silicon carbide single crystal substrate according to claim 1, wherein said pretreatment etching is performed at a temperature of 1,550 to 1,650° C.

5. The production process of an epitaxial silicon carbide single crystal substrate according to claim 1, wherein in said pretreatment etching, the etching amount is from 0.1 to 1 μm.

6. The production process of an epitaxial silicon carbide single crystal substrate according to claim 1, wherein said epitaxial growth is performed by a thermal chemical vapor deposition process (CVD process).

7. The production process of an epitaxial silicon carbide single crystal substrate according to claim 1, wherein the off-angle of said silicon carbide single crystal substrate is 4° or less.

* * * * *